US009806128B2

(12) United States Patent
Tan et al.

(10) Patent No.: US 9,806,128 B2
(45) Date of Patent: Oct. 31, 2017

(54) INTERPOSERS FOR INTEGRATED CIRCUITS WITH MULTIPLE-TIME PROGRAMMING AND METHODS FOR MANUFACTURING THE SAME

(71) Applicant: GLOBALFOUNDRIES Singapore Pte. Ltd., Singapore (SG)

(72) Inventors: Juan Boon Tan, Singapore (SG); Yi Jiang, Singapore (SG); Danny Shum, Singapore (SG); Shunqiang Gong, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/719,467

(22) Filed: May 22, 2015

(65) Prior Publication Data

US 2016/0343773 A1   Nov. 24, 2016

(51) Int. Cl.
| | | |
|---|---|---|
| H01L 29/00 | (2006.01) |
| H01L 27/24 | (2006.01) |
| H01L 27/22 | (2006.01) |
| H01L 45/00 | (2006.01) |
| H01L 43/08 | (2006.01) |
| H01L 43/12 | (2006.01) |

(52) U.S. Cl.
CPC ........ *H01L 27/2436* (2013.01); *H01L 27/228* (2013.01); *H01L 43/08* (2013.01); *H01L 43/12* (2013.01); *H01L 45/06* (2013.01); *H01L 45/144* (2013.01); *H01L 45/16* (2013.01); *H01L 2224/16225* (2013.01); *H01L 2924/15311* (2013.01)

(58) Field of Classification Search
CPC ............ H01L 27/1023; H01L 27/1052; H01L 27/108; H01L 27/10805; H01L 27/10847; H01L 27/10894; H01L 27/11502–27/11597; H01L 27/11803–27/11898; H01L 27/222–27/24; H01L 29/792–29/7923; H01L 45/04; H01L 27/2436
See application file for complete search history.

(56) References Cited

U.S. PATENT DOCUMENTS

| 6,451,624 B1* | 9/2002 | Farnworth ............ H01L 24/06 |
| | | 257/E25.023 |
| 9,106,229 B1* | 8/2015 | Hutton ................. H03K 19/173 |
| 2009/0261433 A1* | 10/2009 | Kang ..................... H01L 43/08 |
| | | 257/421 |
| 2010/0097842 A1* | 4/2010 | Hwang .................. G11C 11/56 |
| | | 365/148 |
| 2012/0028412 A1* | 2/2012 | Jeong ............... H01L 21/76898 |
| | | 438/107 |
| 2012/0193779 A1* | 8/2012 | Lee ..................... H01L 23/3135 |
| | | 257/737 |
| 2013/0051117 A1* | 2/2013 | En ....................... H01L 27/0688 |
| | | 365/148 |

* cited by examiner

*Primary Examiner* — Cuong B Nguyen
(74) *Attorney, Agent, or Firm* — Lorenz & Kopf, LLP

(57) ABSTRACT

An interposer for an integrated circuit includes a first side and a second side. The interposer includes a substrate and a via disposed in the substrate. A first electrical contact is disposed on the first side. A second electrical contact is disposed on the second side and electrically connected to the via. The interposer also includes a multiple-time programmable ("MTP") element electrically connected to the first electrical contact and/or the via.

20 Claims, 5 Drawing Sheets

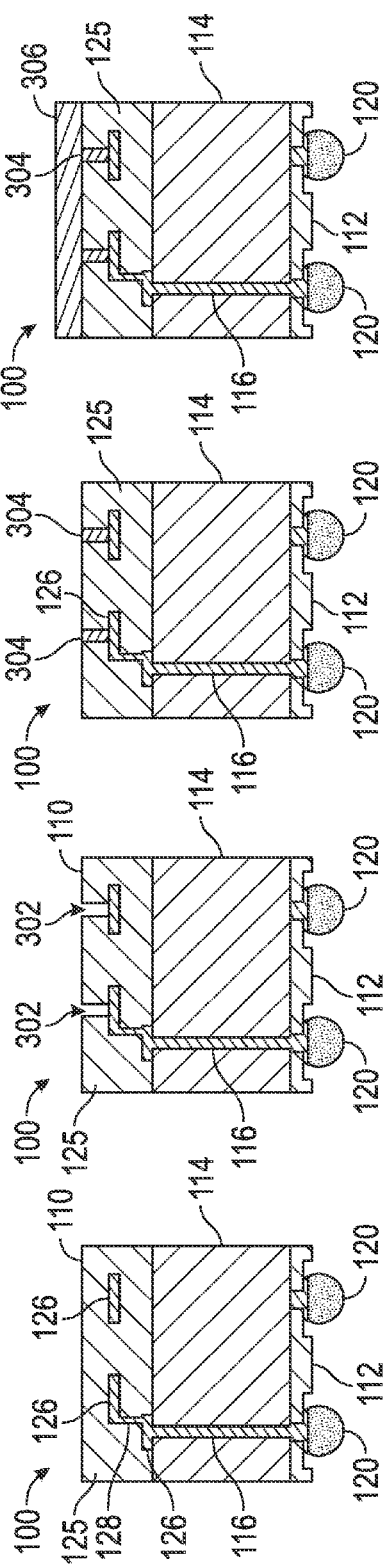
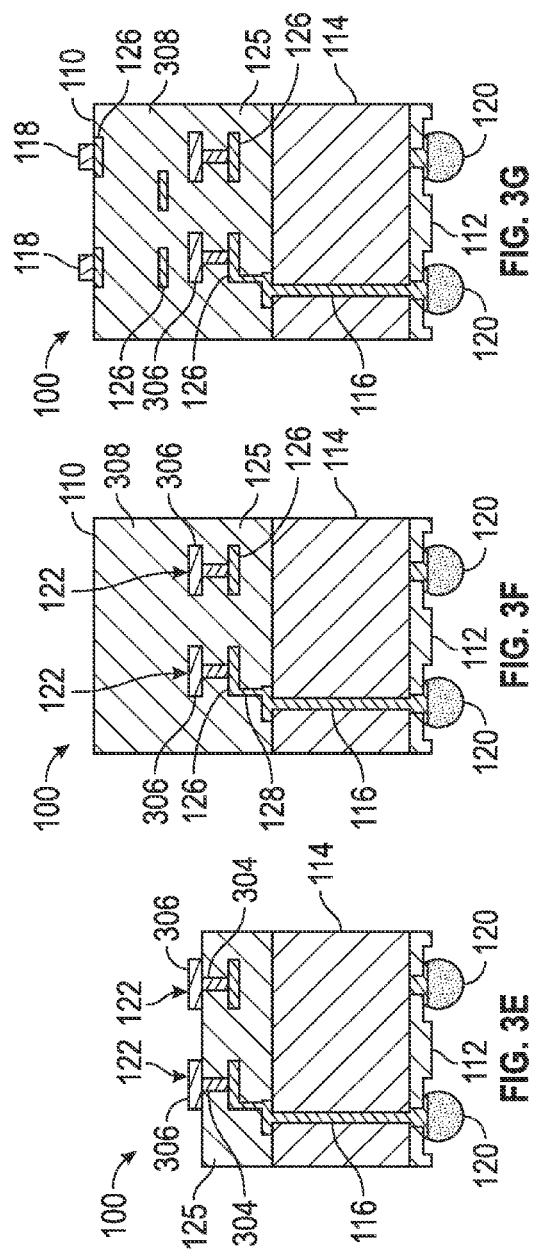

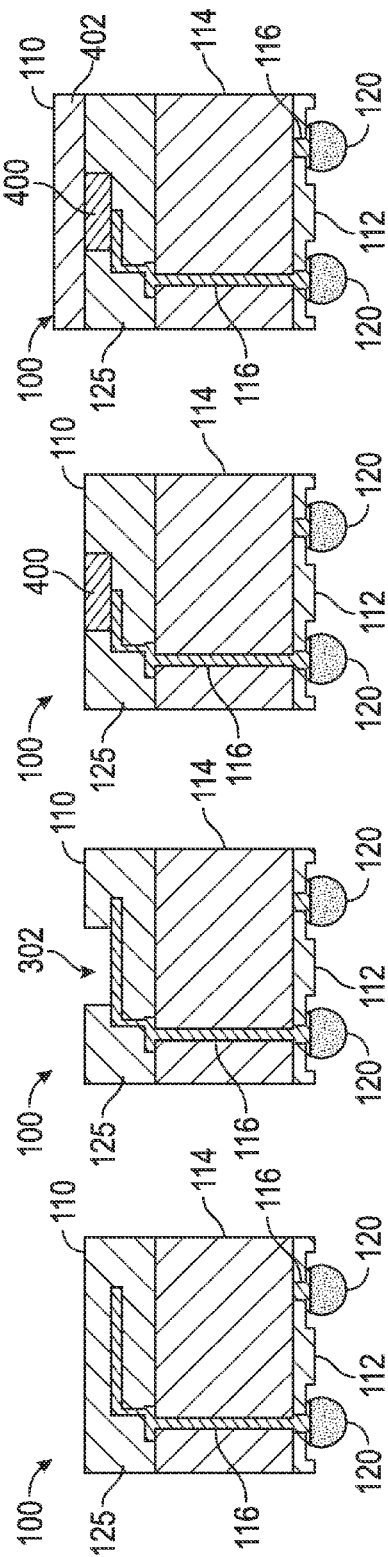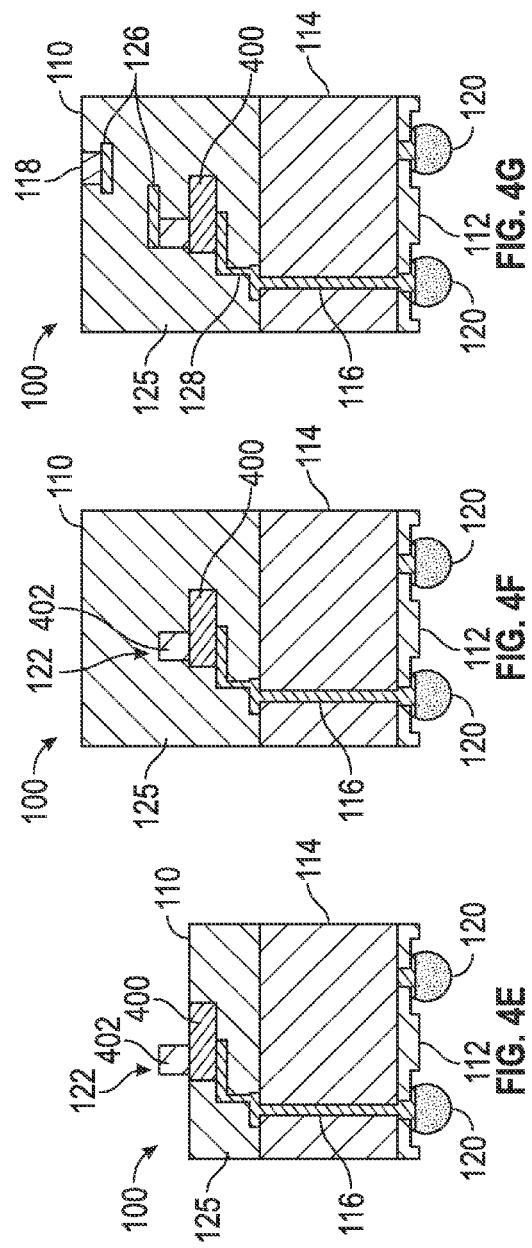

INTERPOSERS FOR INTEGRATED CIRCUITS WITH MULTIPLE-TIME PROGRAMMING AND METHODS FOR MANUFACTURING THE SAME

TECHNICAL FIELD

The technical field relates generally to interposers for integrated circuits and methods for manufacturing such interposers, and more particularly to 3D integrated circuits with interposers with integrated multiple-time programming capabilities and methods for manufacturing such integrated circuits.

BACKGROUND

In many 3D integrated circuits, transistor-based memory cells utilize fuses, thus making the memory cells "one-time programmable". One issue with the use of such fused memory cells is that the programming creates permanent changes to the silicon, which can be easily detected and reversed engineered with physical inspection.

Another issue with 3D integrated circuits is the lack of control of peripheral chips from a main controller chip. Often times, these peripheral chips are always powered up and running, even when not necessary.

As such, it is desirable to provide an interposer for an integrated circuit that allows for multiple-time programming. It is also desirable to provide an integrated circuit with the ability for control of peripheral functional chips. Furthermore, other desirable features and characteristics of the present invention will become apparent from the subsequent detailed description and the appended claims, taken in conjunction with the accompanying drawings and this background.

BRIEF SUMMARY

An integrated circuit, according to one embodiment, includes a plurality of transistors. The integrated circuit includes an interposer having a first side and a second side, with the second side disposed opposite the first side. The interposer includes a substrate and a plurality of vias disposed in the substrate. A plurality of first electrical contacts is disposed on the first side. At least one of the first electrical contacts is electrically connected to at least one of the transistors. A plurality of second electrical contacts is disposed on the second side. Each of the second electrical contacts is electrically connected to at least one of the plurality of vias. At least one multiple-time programmable ("MTP") element is electrically connected to the first electrical contacts and/or the vias.

A method of manufacturing an interposer having a first side and a second side, according to another embodiment, includes forming a via in a substrate. The method further includes forming a first electrical contact on the first side of the interposer. A second electrical contact is formed on the second side of the interposer and electrically connected to the via. The method also includes forming a MTP element electrically connected to the first electrical contact and/or the via.

An interposer for an integrated circuit, according to another embodiment, defines a first side and a second side. The interposer includes a substrate and a plurality of vias disposed in the substrate. A plurality of first electrical contacts is disposed on the first side of the interposer. At least one of the first electrical contacts is electrically connected to at least one of the transistors. A plurality of second electrical contacts is disposed on the second side of the interposer. Each of the second electrical contacts are electrically connected to at least one of the plurality of vias. The interposer also includes at least one MTP element electrically connected to at least one of the first electrical contacts and at least one of the vias. The at least one MTP element comprises germanium-antimony-tellurium ("GST").

BRIEF DESCRIPTION OF THE DRAWINGS

Other advantages of the disclosed subject matter will be readily appreciated, as the same becomes better understood by reference to the following detailed description when considered in connection with the accompanying drawings wherein:

FIGS. 3A-3G are partial cross-sectional representations of a portion of an interposer of the integrated circuit of FIG. 1 at various stages of fabrication according to one exemplary embodiment;

FIGS. 4A-4G are partial cross-sectional representations of a portion of an interposer of the integrated circuit of FIG. 1 at various stages of fabrication according to another exemplary embodiment.

DETAILED DESCRIPTION

The following detailed description is merely exemplary in nature and is not intended to limit the various embodiments and uses thereof. Furthermore, there is no intention to be bound by any theory presented in the preceding background or the following detailed description.

Referring to the figures, wherein like numerals indicate like parts throughout the several views, an interposer 100 for an integrated circuit 102 and method 500 of manufacturing the interposer 100 is shown and described herein.

Figure 1:
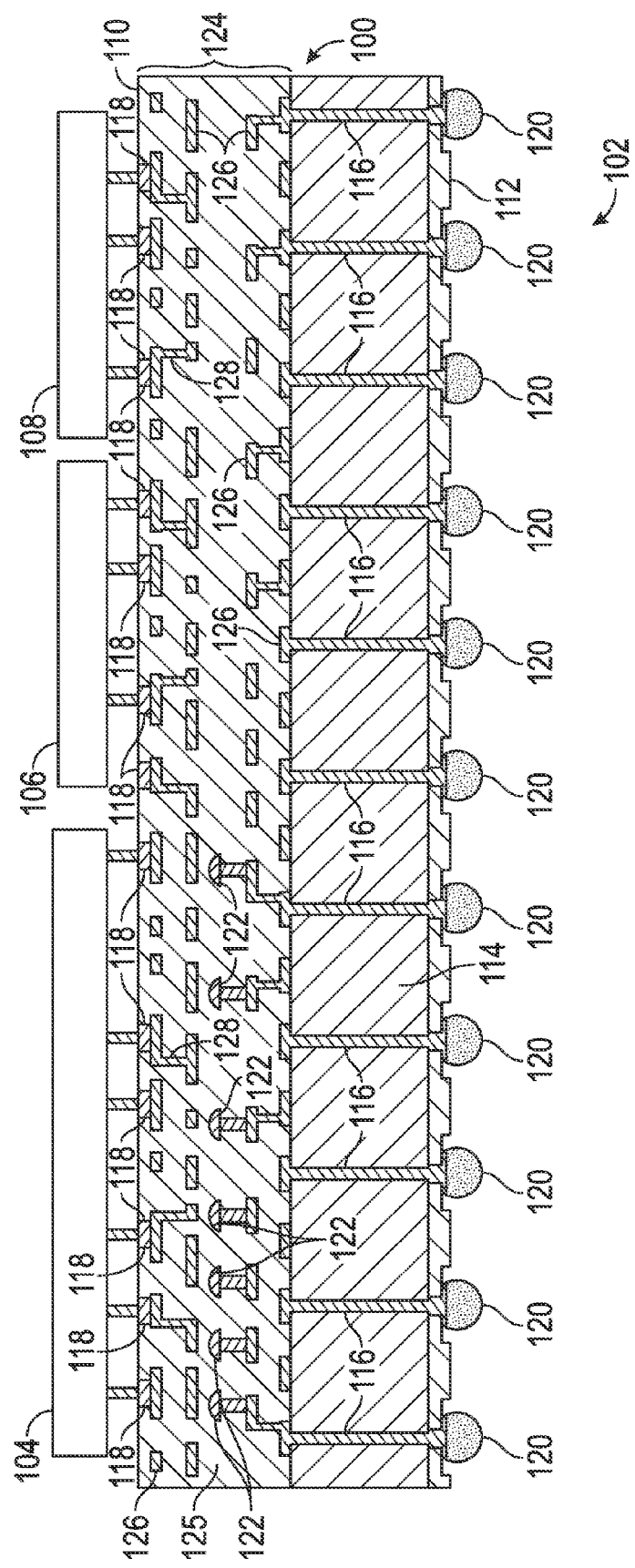
FIG. 1 is a partial cross-sectional representation of a portion of an integrated circuit of one exemplary embodiment.

Referring to FIG. 1, the integrated circuit 102 within which the interposer 100 may be utilized may be a three-dimensional ("3D") integrated circuit, a 2.5D integrated circuit, or other appropriate "stacked" integrated circuits as appreciated by those skilled in the art. The exemplary integrated circuit 102 shown in FIG. 1 includes a first chip 104, a second chip 106, and a third chip 108 electrically connected to the interposer 100. However, it should be appreciated that any number of chips 104, 106, 108 may be utilized in alternate embodiments of the integrated circuit 102.

The interposer 100 defines a first side 110 and a second side 112. The first side 110 and the second side 112 are disposed opposite from one another as shown in FIG. 1. The first side 110 may also be referred to as a "front side" while the second side 112 may also be referred to as a "back side". In the illustrated embodiment, the first side 110 of the interposer faces the chips 104, 106, 108. However, it should be appreciated that the particular labels of the sides 110, 112 of the interposer 100 are for illustration purposes only and may be reversed or otherwise altered.

The interposer 100 includes a semiconductor substrate 114. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

The interposer 100 further include a via 116 disposed in the substrate 114. The via 116 is electrically conductive such that electrical current may be transferred therethrough. For example, the via 116 may include, but is not limited to, copper, other metals, and/or a doped semiconductor.

In the exemplary embodiment, the via 116 extends longitudinally through at least a portion of the substrate 114 from the second side 112 toward the first side 110. As such, in the exemplary embodiment, the via 116 may be referred to as a through-silicon via ("TSV") 116. Also in the exemplary embodiment, a plurality of through-silicon vias ("TSVs") 116 are disposed through the silicon substrate 114. The terms TSV and TSVs may be used hereafter with the understanding that only a single TSV 116 is required in some embodiments.

The interposer 100 also includes a first electrical contact 118 disposed on the first side 110 and a second electrical contact 120 disposed on the second side 112. The term "disposed on" does not limit the electrical contacts 118, 120 to be placed completely on top of the respective sides 110, 112. For instance, the contacts may be at least partially embedded in the surface defined by the respective sides 110, 112. An example is shown in FIG. 1, where the first electrical contact 118 is shown below the surface defining the first side 110.

The interposer 100 of the exemplary embodiment includes a plurality of first electrical contacts 118 and a plurality of second electrical contacts 120. The electrical contacts 118, 120 of the exemplary embodiment are formed of an electrically-conductive material. Electrically-conductive material, as referred to herein, includes any material having a resistivity of $1 \times 10^{-7}$ ohm*m or less at 20° C. Examples of suitable electrically-conductive materials include metal such as, but not limited to, copper, alloys of tin and lead, or other electrically-conductive metals. In some embodiments, the electrically-conductive material may be about 90 mass percent or more copper, and various copper alloys can be used, some of which include less than 90 mass percent copper. In embodiments, the first electrical contacts 118 may be referred to as conductive pads and may provide electrical connections to the chips 104, 106, 108. In this embodiment, the first electrical contacts 118 include copper. In embodiments, the second electrical contacts 120, may be referred to as solder balls and may provide electrical connections to external devices (not shown), e.g., a circuit board. The solder balls may alternatively be referred to as package balls, solder bumps, or solder spheres. In an exemplary embodiment, the solder balls comprise an alloy of tin and lead. However, other materials may also be utilized in forming the solder balls, including, but not limited to, silver and gold.

The second electrical contacts 120 of the exemplary embodiment are electrically connected to the vias 116. In the exemplary embodiment, as shown in FIG. 1, each second electrical contact 120 is electrically connected to one via 116. However, it should be appreciated that in other embodiments (not shown), each second electrical contact 120 may be electrically connected to more than one via 116.

The interposer 100 also includes a multiple-time programmable ("MTP") element 122. In the exemplary embodiment, the MTP element 122 is electrically connected to the first electrical contact 118 and/or the via 116. Of course, if connected to the via 116, the MTP element 122 is also connected to the second electrical contact 120. In the exemplary embodiment, the interposer 100 includes a plurality of MTP elements 122.

The MTP element 122 may include any suitable material that allows multiple-time programming. These materials include, but are not limited to, a phase-change material and a magnetic material. The phase-change material may alternatively be referred to as phase-change memory ("PCM"). One suitable phase change material is germanium-antimony-tellurium, commonly abbreviated to "GeSbTe" or simply "GST". Those skilled in the art appreciate other suitable phase change materials. In one embodiment, the magnetic material may be implemented with a magnetic tunnel junction ("MTJ"), sometimes referred to as a MTJ stack.

"Multiple-time programming", as used herein" means that the MTP element 122 may have its state changed in order to program a memory element, e.g., a transistor, such that a charge may be maintained, or not maintained, in the memory element. The phase change material may be changed by changing the temperature of the material, e.g., by passage of an electric current through a heating element (not shown), which changes the material between an amorphous state and a crystalline state. For example, the phase change material may be "set" by applying a current such that a crystallization temperature is maintained for a first predetermined amount of time. The phase change material may be "reset" by applying a current such that a melting temperature is maintained for a second predetermined amount of time.

The interposer 100 may also include a plurality of front side layers 124. These front side layers 124 may include a plurality of metal layers 126 and additional vias 128. These front side layers 124 may be selectively etched, i.e., strategically removed, to provide specific electrical connections and/or electrical routings between the first electrical contacts 118 and the second electrical contacts 120. In the illustrated embodiments, the front side layers 124 are disposed in a dielectric layer 125, e.g., a low-K oxide or a tetraethyl orthosilicate ("TEOS") oxide.

The MTP elements 122 of the exemplary embodiment are also disposed within these front side layers 124. Accordingly, the MTP elements 122 may not be disposed immediately adjacent to the first side contacts 118 and/or the vias 116 to which they are electrically connected, but rather may be physically spaced from the first side contacts 118 and/or the vias 116 optionally with one or more metal layers 126 and/or additional vias 128 disposed between the MTP elements 122 and the first side contacts 118 or the vias 116.

Figure 2:
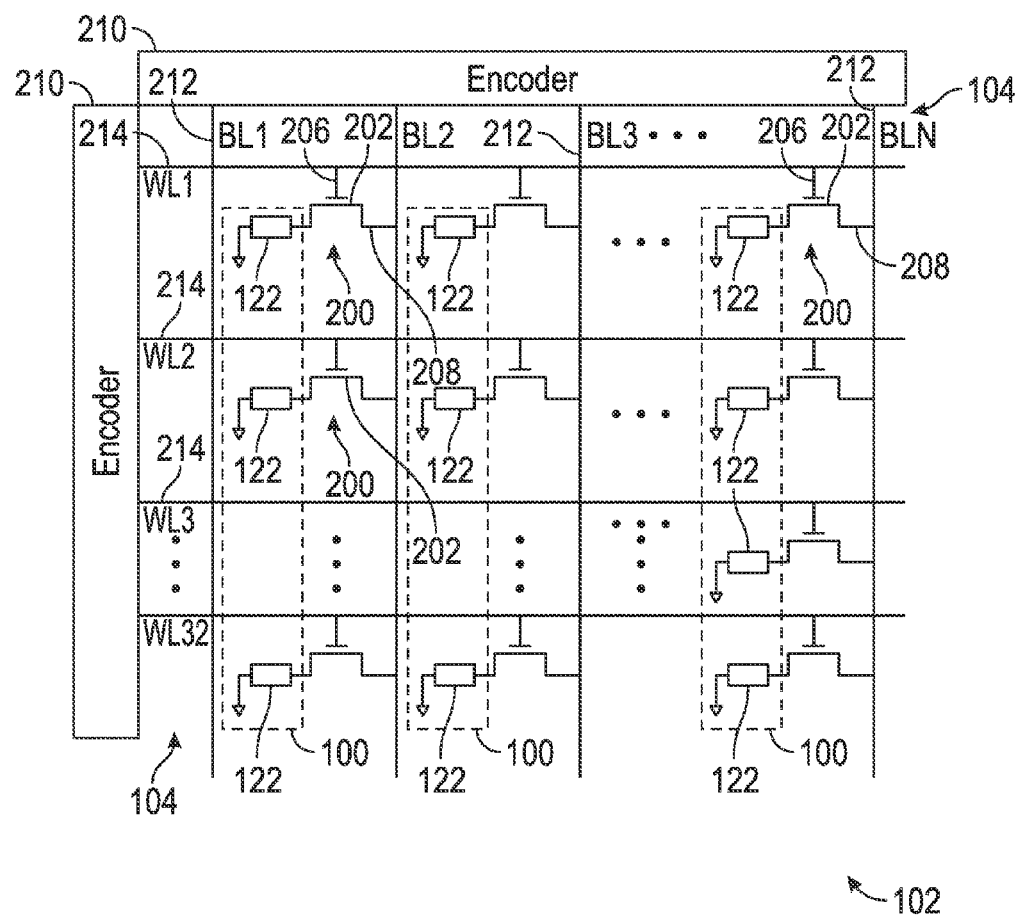
FIG. 2 is a partial electrical schematic diagram of the integrated circuit of FIG. 1 according to one exemplary embodiment.

Referring now to FIG. 2, the integrated circuit 100 may also include at least one transistor 200. In the exemplary embodiment, the integrated circuit 100 includes a plurality of transistors 200. The terms transistor 200 and transistors 200 may be used hereafter with the understanding that only a single transistor 200 is required. Each of the chips 104, 106, 108 may include one or more of the transistors 200.

Alternatively, the transistors 200 may be disposed in other parts of the integrated circuit 102, including the interposer 100.

The transistors 200 in the exemplary embodiment are metal-oxide-silicon field-effect transistors ("MOSFETs") 202. Each MOSFET 202, as shown in the schematic in FIG. 2, includes a source 204, a gate 206, and a drain 208, as is appreciated by those skilled in the art. Each MTP element 122 is electrically connected to either a source 204 or a drain 208 of the associated transistor 200. As such, each MOSFET 202 may be controlled by activation and/or deactivation of the respective MTP element 122.

In the exemplary embodiment, the transistors 200 are disposed in the first chip 104. Furthermore, in the exemplary embodiment, the first chip 104 is wire bonded to the interposer 100. More specifically, the first chip 104 is wire bonded to the first electrical contacts 118, although it is to be appreciated that the first chip 104 may be electrically connected to the interposer 100 through bonds other than wire bonds. The first chip 104, which may be a main controller (not separately numbered) for the integrated circuit 102, includes an encoder 210 electrically connected to the transistors 200 via a plurality of bit lines 212 and word lines 214. As such, the encoder 210 is able to select which of the transistors 200 is activated and/or deactivated.

Specifically, in the embodiment shown in FIG. 2, the bit lines 212 are electrically connected to the drains 208 of the MOSFETs 202 while the word lines 214 are electrically connected to the gates 206 of the MOSFETs. As such, the encoder 210 may be utilized to select the particular MOSFET 202 to analyze the state of the respective MTP element 122, and thus its programming.

Referring once again to FIG. 1, the integrated circuit 102 may further include other chips, e.g., the second and third chips 106, 108, other than the first chip 104. These chips 106, 108 are electrically connected to the interposer 100. As such, these chips 106, 108 may also be electrically connected to one or more of the MTP elements 122. This allows the MTP elements 122 to turn on and/or turn off the second and/or third chips 106, 108. As such, the first chip 104 may utilize the MTP elements 122 to control activation of the second and/or third chips 106, 108.

Those skilled in the art appreciate that fabrication of integrated circuits 102 is typically broken down into front-end-of-line ("FEOL") processing and back-end-of-line ("BEOL") processing. The formation of the MTP elements 122 may be handled during the BEOL processing, as described in greater detail below.

In one embodiment, as shown in FIGS. 3A-3G, the interposer 100 is formed with a phase change material as the MTP element 122. FIG. 3A illustrates a plurality of vias 116 disposed through the substrate 114 with each via 116 electrically connected to one of the second electrical contacts 120. A plurality of metal layers 126 are formed from copper. The dielectric layer 125 is formed atop the metal layers 126. The dielectric layer 125 may be formed, for example, from TEOS 125. Next, as shown in FIG. 3B, the dielectric layer 125 is etched to expose voids 302 adjacent the metal layers 126 with a surface thereof exposed in the void 302.

Referring now to FIG. 3C, tungsten 304 is deposited in the voids 302 such that the tungsten is electrically connected to the metal layers 126. The exposed side of the dielectric layer 125 then undergoes chemical-metal polishing ("CMP"), also referred to as chemical-metal planarization. Next, as shown in FIG. 3D, a layer of phase change material 306, such as GST, is deposited. The layer of phase change material 306 is then etched, as shown in FIG. 3E, to produce the MTP elements 122. Then, a deposition of another dielectric 308 and CMP is performed, as shown in FIG. 3F. Finally, the BEOL process continues, as shown in FIG. 3F, to produce additional metal layers 126, the vias 128, and the first electrical contacts 118.

Another embodiment of forming the interposer 100 is shown in FIGS. 4A-4G. In this embodiment, the interposer 100 is formed with a magnetic material as the MTP element 122. FIG. 4A illustrates a plurality of vias 116 disposed through the substrate 114 with each via 116 electrically connected to one of the second electrical contacts 120. A plurality of metal layers 126 is formed from in the same manner as described above. Next, as shown in FIG. 4B, the dielectric layer 125 is etched to expose at least one void 302 adjacent and over one of the metal layers 126, with a surface thereof exposed in the void 302.

Referring now to FIG. 4C, tantalum nitride ("TaN") 400 is deposited in the at least one void 302 such that the TaN is electrically connected to at least one of the metal layers 126. The first side 110 of the interposer 100 then undergoes CMP. Next, as shown in FIG. 4D, an MTJ stack 402 is formed. The MTJ stack 402 is then etched, as shown in FIG. 4E, to produce one of the MTP elements 122. Then, a deposition of another dielectric 308 and CMP is performed, as shown in FIG. 4F. Finally, the BEOL process continues, as shown in FIG. 4F, to produce additional metal layers 126, the vias 128, and the first electrical contacts 118.

Figure 5:
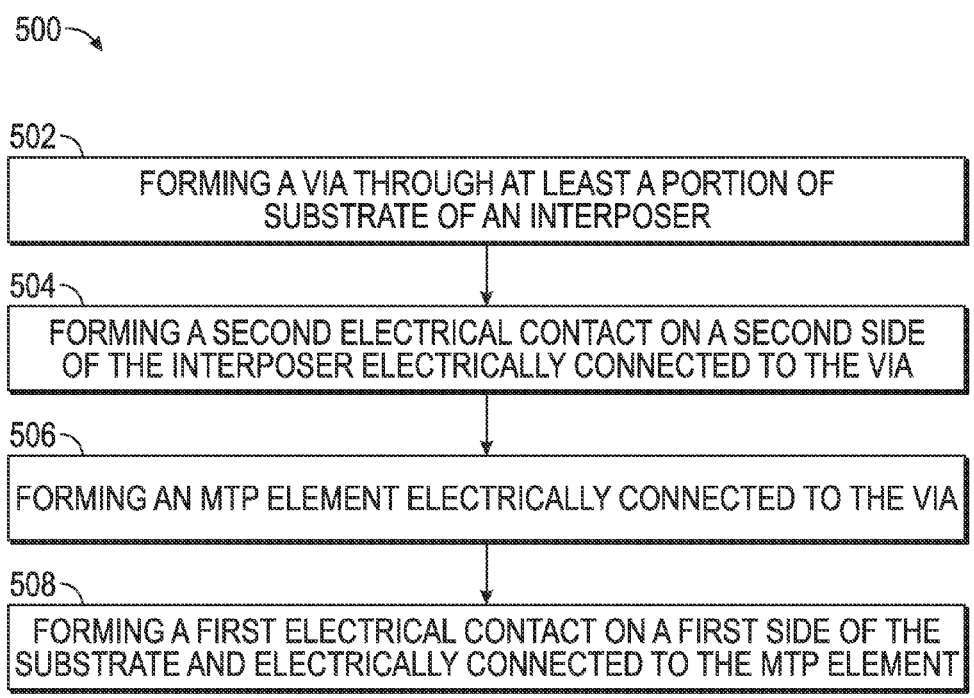
FIG. 5 is a flowchart showing a method of manufacturing an interposer according to one embodiment.

Referring to FIG. 5, a summary of the methods 500 of manufacturing the interposer 100 according to the multiple embodiments as shown in FIGS. 3A-4G is provided. The method 500 includes, at 502, forming the via 116 through at least a portion of the substrate 114. The method 500 also includes, at 504, forming a second electrical contact 120 on the second side 112 of the interposer, where the second electrical contact 120 is electrically connected to the via 116. The method 500 further includes, at 506, forming the MTP element 122 electrically connected to the via 116. The method 500 also includes, at 508, forming a first electrical contact 118 on the first side of the interposer 100 and electrically connected to the MTP element 122.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. An integrated circuit, comprising:
    a plurality of transistors; and
    an interposer having a first side and a second side disposed opposite said first side, said interposer comprising:
        a substrate,
        a plurality of vias disposed in said substrate,
        a plurality of first electrical contacts disposed on said first side of said interposer, wherein at least one of said first electrical contacts is electrically connected to at least one of said transistors, and wherein said plurality of transistors are disposed adjacent said plurality of first electrical contacts, a dielectric layer disposed between said plurality of transistors and said substrate, a plurality of second electrical contacts comprising solder balls disposed on said second side and wherein each of said second electrical contacts are electrically connected to at least one of said plurality of vias, and at least one multiple-time programmable ("MTP") element disposed in said dielectric layer between said plurality of transistors and said substrate, and electrically connected to said first electrical contacts and/or said plurality of vias.

2. The integrated circuit as set forth in claim 1, wherein said at least one MTP element comprises a phase-change material.

3. The integrated circuit as set forth in claim 2, wherein said phase-change material comprises germanium-antimony-tellurium ("GST").

4. The integrated circuit as set forth in claim 1, wherein said at least one MTP element comprises a magnetic material.

5. The integrated circuit as set forth in claim 4, wherein said interposer includes a magnetic tunnel junction ("MTJ") stack and wherein said magnetic material is included in said MTJ stack.

6. The integrated circuit as set forth in claim 1, wherein said MTP element is electrically connected between at least one of said first electrical contact and at least one of said plurality of vias.

7. The integrated circuit as set forth in claim 1, wherein said plurality of transistors comprises a plurality of metal-oxide-silicon field-effect transistors (MOSFETs) each having a source, a gate, and a drain.

8. The integrated circuit as set forth in claim 7, wherein said at least one MTP element is electrically connected to one of said source or said drain of one of said MOSFETs.

9. The integrated circuit as set forth in claim 1, further comprising a first chip comprising at least one of said plurality of transistors.

10. The integrated circuit as set forth in claim 9, further comprising a second chip electrically connected to at least one of said vias such that said first chip may control power to said second chip via said at least one MTP element.

11. The integrated circuit as set forth in claim 10, wherein said second chip comprises at least one of said plurality of transistors.

12. A method of manufacturing an interposer having a first side and a second side disposed opposite the first side, said method comprising:

forming a first electrical contact on the first side of the interposer;

disposing a transistor adjacent the first electrical contact;

forming a via in a substrate;

forming a dielectric layer between the transistor and the substrate;

forming a second electrical contact comprising solder balls on the second side of the interposer and electrically connected to the via; and forming a multiple-time programmable ("MTP") element in the dielectric layer between the transistor and the substrate, and electrically connected to the via and/or the first contact.

13. The method as set forth in claim 12, wherein said forming the MTP element comprises forming the MTP element with a phase-change material.

14. The method as set forth in claim 12, wherein said forming the MTP element comprises forming the MTP element with a magnetic material.

15. The method as set forth in claim 12, wherein said forming the MTP element comprises forming a magnetic tunnel junction ("MTJ") stack.

16. The method as set forth in claim 12, wherein forming the MTP element is performed during back-end-of-line ("BEOL") processing.

17. The method as set forth in claim 12, further comprising forming at least one metal layer electrically connected to and disposed between the via and the MTP element.

18. The method as set forth in claim 12, further comprising forming an electrical connection between said MTP element and said first electrical contact.

19. The method as set forth in claim 18, where said forming an electrical connection between said MTP element and said first electrical contact comprises forming a plurality of metal layers and additional vias.

20. An interposer for an integrated circuit, said integrated circuit comprising a plurality of transistors, said interposer defining a first side and a second side, comprising:

a substrate;

a plurality of vias disposed in said substrate;

a plurality of first electrical contacts disposed on said first side of said interposer, wherein at least one of said first electrical contacts is electrically connected to at least one of said transistors, and wherein said plurality of transistors are disposed adjacent said plurality of first electrical contacts;

a dielectric layer disposed between said plurality of transistors and said substrate:

a plurality of second electrical contacts comprising solder balls disposed on said second side of said interposer, wherein each of said second electrical contacts are electrically connected to at least one of said plurality of vias; and at least one multiple-time programmable ("MTP") element disposed in said dielectric layer between said plurality of transistors and said substrate, and electrically connected to at least one of said first electrical contacts and at least one of said vias;

said at least one MTP element comprising germanium-antimony-tellurium ("GST").

* * * * *